(12) United States Patent
Gupta et al.

(10) Patent No.: US 12,123,911 B1
(45) Date of Patent: Oct. 22, 2024

(54) INTEGRATED CIRCUIT WITH TIMING CORRECTION CIRCUITRY

(71) Applicant: NXP USA, Inc., Austin, TX (US)

(72) Inventors: Shilpa Gupta, Rohini (IN); Rishi Bhooshan, Noida (IN); Anis Mahmoud Jarrar, Austin, TX (US); David Russell Tipple, Leander, TX (US); Hadi Ahmadi Balef, Eindhoven (NL)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/354,925

(22) Filed: Jul. 19, 2023

(30) Foreign Application Priority Data

Apr. 14, 2023 (IN) .............................. 202311027607

(51) Int. Cl.
*G01R 31/28* (2006.01)
*G01R 31/317* (2006.01)
*G01R 31/3185* (2006.01)
*G01R 31/3193* (2006.01)

(52) U.S. Cl.
CPC ................ *G01R 31/318525* (2013.01); *G01R 31/31727* (2013.01); *G01R 31/31932* (2013.01)

(58) Field of Classification Search
CPC .... G01R 31/318525; G01R 31/318536; G01R 31/31727
See application file for complete search history.

(56) References Cited

U.S. PATENT DOCUMENTS 6,526,106 B1 *  2/2003  Migita ...................... H04L 7/02
                                                  375/354
8,555,124 B2   10/2013  Idgunji et al.
9,229,054 B2    1/2016  Bowman et al.
10,114,068 B1  10/2018  Chen et al.
10,454,484 B1 * 10/2019  Shi ....................... G11C 11/4076
10,585,143 B2   3/2020  Urard et al.
2007/0168848 A1  7/2007  Tschanz et al.
(Continued)

FOREIGN PATENT DOCUMENTS

CN      112350668 A    2/2021
EP      0782293 A2     2/1997
EP      3923472        12/2021
WO      WO-2019106226 A1  6/2019

OTHER PUBLICATIONS

U.S. Appl. No. 17/649,623, Jarrar, et al.: "Integrated Circuit Having an In-Situ Circuit for Detecting an Impending Circuit Failure", filed Feb. 1, 2022.

*Primary Examiner* — Esaw T Abraham
(74) *Attorney, Agent, or Firm* — Joanna G. Geld

(57) ABSTRACT

A margin sensing circuit coupled to a flip flop of a critical data path includes a delay generator, a selector circuit which selects a delayed data output from the delay generator, a shadow latch corresponding to the flip flop, a comparator circuit which provides a match error indicator based on a comparison between a latched data output from the flip flop and a latched shadow output from the shadow latch, and an error latch to provide an error indicator based on the match error indicator. A correcting circuit includes a clock delay generator configured to receive a clock and provide a plurality of delayed clocks, and a clock selector circuit to select a delayed clock of the plurality of delayed clocks based on a set of clock select signals, in which each of the flip flop and the shadow latch are clocked by the selected delayed clock.

20 Claims, 7 Drawing Sheets

(56) References Cited

U.S. PATENT DOCUMENTS

| | | | |
|---|---|---|---|
| 2012/0230144 A1* | 9/2012 | Nagata | G11C 8/18 |
| | | | 365/233.11 |
| 2017/0269151 A1 | 9/2017 | Favi et al. | |
| 2017/0309323 A1* | 10/2017 | Ishibashi | G11C 7/222 |
| 2021/0191452 A1* | 6/2021 | Herberholz | G06F 30/3312 |
| 2021/0335403 A1* | 10/2021 | Choi | G11C 7/1057 |

* cited by examiner

INTEGRATED CIRCUIT WITH TIMING CORRECTION CIRCUITRY

CROSS-REFERENCE TO RELATED APPLICATIONS

This application claims the priority under 35 U.S.C. § 119 of India application no. 202311027607, filed on 14 Apr. 2023, the contents of which are incorporated by reference herein.

BACKGROUND

Field

This disclosure relates generally to integrated circuits, and more specifically, to an integrated circuit with timing correction circuitry.

Related Art

Silicon devices, such as integrated circuits, generally age with use. This aging effect slows down the functional operation of the device by, for example, increasing delay time of the signal paths on the device. When the device ages, some paths will increase in delay to the point of failure. However, it is not known at design time which path will fail first, but the failure is dependent upon how the device is being used in an application. Failure of the device can lead to catastrophic events, especially in life critical applications such as auto drive support, adaptive breaking support, and other similar life critical applications. Therefore, in one aspect, there is a need for a timing correction circuit which can provide warning that the device is nearing failure as well as apply correction to the critical path so as to extend the life of the device before failing.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In many devices, a top percentage (e.g. the top 1%) of the most timing critical paths can be identified. Margin sensing circuitry can be used to identify when a critical path is nearing the failure point, and, in response to such identification, apply timing correction in order to extend the life of the product, even during aging. Once timing correction can no longer be applied to offset the aging effects in the critical path, appropriate action can be taken, such as providing maintenance warnings, providing disabling capabilities, or even controlling a shutdown process. Therefore, in one embodiment, critical and near critical endpoints along critical paths are implemented with margin sensing and correcting flip flops. The margin sensing portion can identify a warning level for impending failure due, for example, to aging, and the correcting portion can adjust a clock delay so as to extend the time until a critical warning level is reached. In one embodiment, self testing is performed with the margin sensing and correcting flip flops in order to adjust the clock delay paths of critical and near critical endpoints, which may result in extending the life of the product before failure due to aging.

Figure 1:
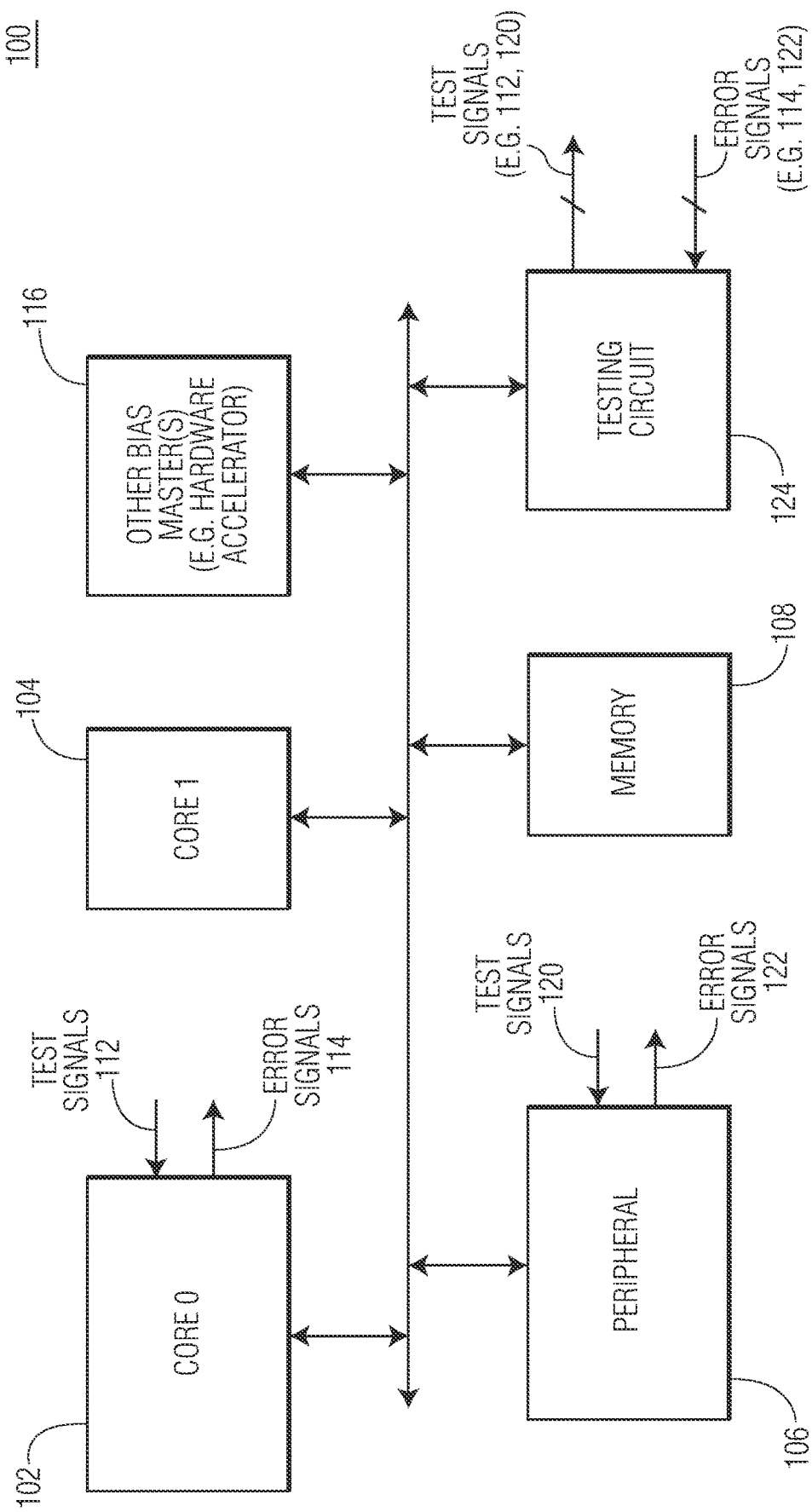
FIG. 1 illustrates, in block diagram form, a system on a chip (SoC) including testing circuitry in accordance with one embodiment of the present invention.

FIG. 1 illustrates, in block diagram form, an SoC 100 in accordance with one embodiment of the present invention. SoC 100 can be implemented as an integrated circuit which includes any number of semiconductor devices which generally age with use. In the illustrated embodiment, SoC 100 includes a first core 102 (core 0) and a second core 104 (core 1). Although only two cores are illustrated, SoC 100 can include any number of cores, and each core can be any type of core. SoC 100 may also include any number of other bus master(s) 116 (or, alternatively, may not include any other bus masters). One of these other bus masters may include, for example, a hardware accelerator. SoC 100 may also include a peripheral 106, and a memory 108. While only one peripheral and one memory are illustrated, SoC 100 may include any number and type of peripherals and may include any number and type of memories. Therefore, SoC 100 is only provided as an example of an SoC, in which other SoCs or other integrated circuits may include more or fewer elements, or different elements than those illustrated.

Any of the elements of SoC 100 may include one or more functional data paths, in which a portion of those functional data paths can be identified as the most critical timing paths. For example, in one embodiment, during final timing closure in the design phase of SoC 100, critical endpoints with the smallest timing margins are identified in which the endpoint flip flops are replaced with a margin sensing and correcting flip flop (MSCF). A critical endpoint implemented with an MSCF can be referred to as a critical MSCF. An MSCF includes a standard flip flop along with margin sensing and correcting circuitry. Based on a data delay setting (indicated by received select signals), the margin sensing circuitry of an MSCF can selectively delay the incoming data to determine a timing margin for the standard flip flop, and based on a clock delay setting (indicated by received clock select signals), the correcting circuitry of the MSCF can selectively delay the clock to extend the timing margin as the SoC ages. Also, since the clock may be adjusted at each critical MSCF to offset aging effects, the timing margin in downstream flops may also be impacted. Therefore, for those downstream flops which are identified as being near timing critical, they are also replaced with an MSCF. These may be referred to as near critical MSCFs. Each near critical MSCF receives separate select signals and clock select signals as the upstream MSCF so that they can be independently adjusted. In this context, "near" refers to being downstream from a critical MSCF and impacted by timing changes in the critical MSCF.

In the illustrated embodiment of FIG. 1, data paths including MSCFs may be located in core 0 and in peripheral 106. Referring to core 0 receives test signals 112 (including test control signals) and provides one or more error signals 114, in which the provided one or more error signals identify when failure is imminent in the corresponding monitored data path. Similarly, peripheral 106 receives test signals 112 and provides one or more error signals 122. Any of the elements of SoC 100 may include any number of MSCFs, in which each MSCF receives its own select signals and clock select signals and provides a corresponding error signal. SoC 100 also includes a testing circuit 124 (also referred to as testing circuitry 124), which may or may not be coupled to the system interconnect which is coupled to core 0 102, core 1 104, other bus masters 116, peripheral 106, and memory 108. Testing circuit 124 may reside anywhere in SoC 100, or may be distributed within SoC 100. Testing circuit 124 performs self-testing of the MSCFs of SoC 100 by, for example, executing self-test code or implementing a state machine, providing the required test signals to the MSCFs, receiving the error signals from the MSCFs, and processing them accordingly (and may therefore also be referred to as a self-test circuit or as self-test circuitry). Testing circuit 124 may also generate interrupts or initiate a system reset, as needed. In one embodiment, testing circuit 124 is included within a core, such as core 0 102, in which core 0 102 executes the self-test code for MSCFs in core 0 102 or in larger portions of SoC 100.

In one embodiment, the control values used by testing circuit 124 to provide the testing control signals may be programmed by one of the bus masters of SoC 100, such as core 0. The test signals and error signals may be communicated via side band signals or via the system interconnect. In one embodiment, SoC 100 may also include one or more fault control units which receive some or all of the one or more error signals, and may take appropriate actions based on the received error signals, such as performing a system reset of SoC 100, performing indicators or warnings external to SoC 100, logging appropriate information, etc.

Figure 2:
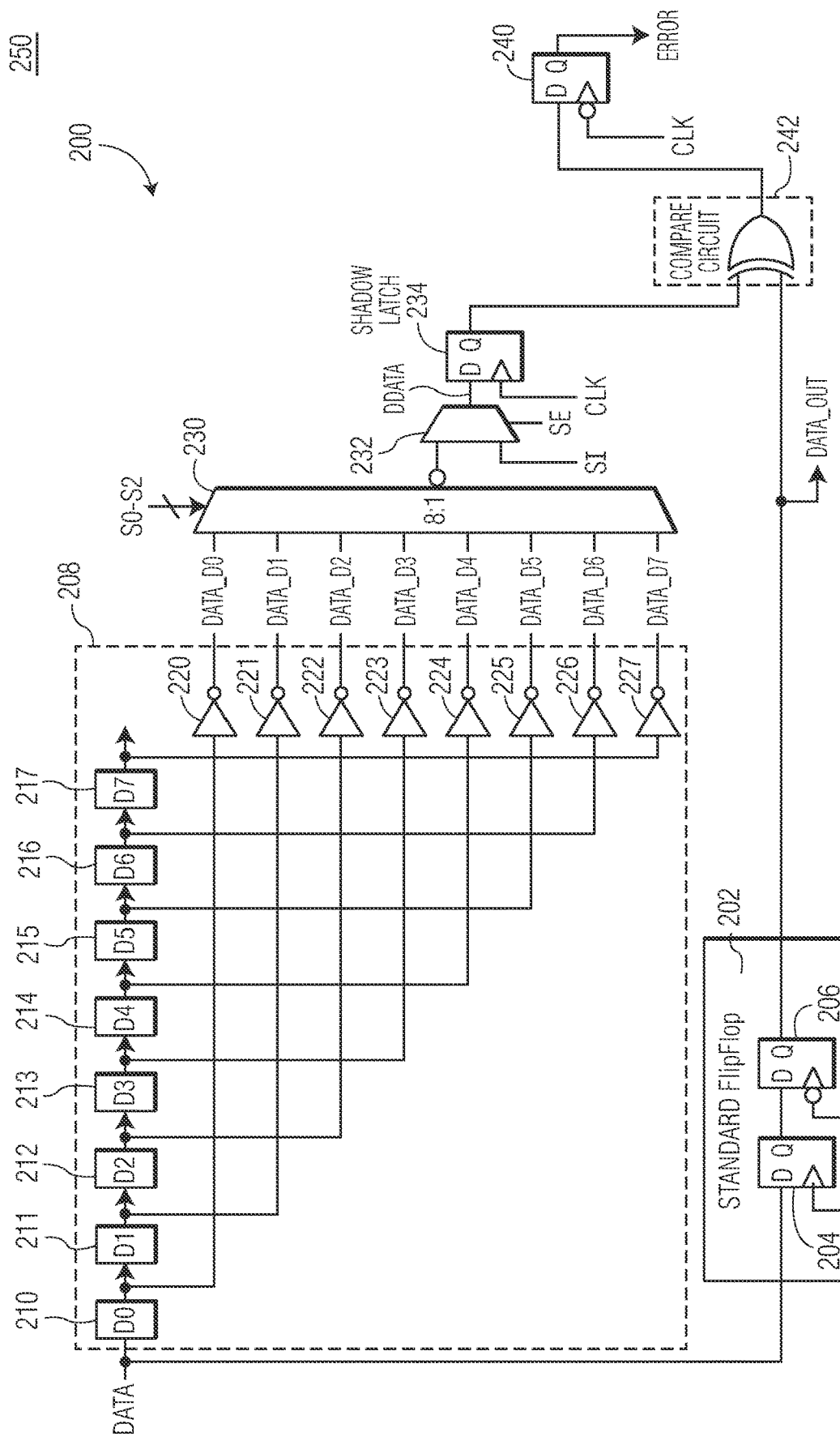
FIG. 2 illustrates, in block diagram form, a standard flip flop along with corresponding margin sensing circuitry, including delay generation circuitry, of the SoC of FIG. 1, in accordance with one embodiment of the present invention.

FIG. 2 illustrates, in block diagram form, an embodiment of a margin sensing flop (MSF) 250 which includes a standard flip flop 202 along with corresponding margin sensing circuitry 200 (which may also be referred to as testing circuitry). In the current example, it is assumed that standard flip flop 202 is within a data path (e.g. identified as a critical data path or critical timing path) of core 0. Margin sensing circuit 200 is coupled to flip flop 202 and includes a delay generator 208, an 8:1 multiplexor (MUX) 230, a 2:1 MUX 232, a shadow latch 234, a compare circuit 242, and an error latch 240. Delay generator 208 receives an incoming bit of data, DATA, and includes eight daisy-chained data delay units D0 210-D7 217 as well as eight inverters 220-227. DATA is propagated through the data delay units (also referred to as the delay units), in which each delay unit of delay units 210-217 provides an output to a corresponding inverter 220-227, respectively. Each inverter of inverters 220-227 provides a corresponding delayed data output, DATA_D0 to DATA_D7, respectively. Since the delay units are daisy chained, the delays of the delay units are additive with each output. For example, DATA_D0 is generated from DATA delayed by delay unit D0, while DATA_D2 is generated from DATA delayed by delay units D0+D1+D2. Similarly, DATA_D6 is generated from DATA delayed by delay units D0+D1+D2+D3+D4+D5+D6. The outputs of inverters 220-227 are provided to MUX 230, in which inverters 220-227 at the output of each delay unit help to sharpen the value of DATA provided to MUX 230. Each delay unit provides a monotonic amount of delay (i.e. an increasing delay), irrespective of rising or falling data edges, and are immune from aging effects.

Because there are eight taps in the daisy chain of delay generator 208 (corresponding to the outputs of D0-D7), MUX 230 is implemented as an 8:1 MUX, in which one of the inputs to MUX 230 is selected based on a 3-bit control signal, S0-S2, which may be received from testing circuit 124 as part of test signals 112. In this manner, by programming the values of S0-S2, a particular tap of the daisy chain can be selected to provide a delayed DATA value, in which each of DATA_D0 up to DATA_D7 provides an increasing delay for the delayed DATA value, in equal incremental steps. Therefore, delay generator 208 along with MUX 230 implement a programmable delay generator, programmed by the received select signals S0-S2. (Select signals S0-S2 may also be referred to as control signals.) The selected delayed DATA value is inverted at the output of MUX 230 (since the inputs were provided via inverters 220-227) and provided to a first input of MUX 232. A second input of MUX 232 receives a scan-in (SI) data value, and a control signal, scan enable (SE) determines whether the output of MUX 230 is provided at the output of MUX 232 as DDATA or the SI data value is provided as DDATA. During normal operation, when scan testing is not occurring (SE=0), the output of MUX 230 is provided as DDATA, and during scan testing (SE=1), SI is provided as DDATA.

Shadow latch 234 is implemented as a D flip flop in which a data input (D) receives DDATA from MUX 232 and a data output (Q) provides its latched shadow value to compare circuit 242. (Note that the data output (Q) of shadow latch 234 may also be referred to as the latched shadow output.) In one embodiment, standard flip flop 202 is implemented as a standard master-slave D flip flop including a master latch 204 and a slave latch 206, in which the data input (D) of master slave 206 receives DATA as the input to standard flip flop 202, and the data output (Q) of slave latch 206 provides DATA_OUT as the output of standard flip flop 202. Master latch 204 receives CLK at its clock input, and shadow latch 206 receives an inverse of CLK at its clock input, as indicated by the bubble on the clock input. DATA_OUT is the data provided to the next element in the functional data path of core 0. The data outputs of standard flip flop 202 and of shadow latch 234 are provided to compare circuit 242. An output of compare circuit 242 (which may be referred to as a match error indicator) is provided to a data input (D) of error latch 240, and a data output (Q) of error latch 240 provides an error indicator (also referred to as an error flag) which indicates whether or not a failure is about to happen (e.g. is imminent). In the illustrated embodiment, each of shadow latch 234 and standard flip flop 202 operate in according with a same clock signal, CLK. (Master-slave flip flop 202 operates as known in the art, in which, e.g., master latch 204 and slave latch 206 may latch the DATA in different phases of CLK.) Error latch 240 receives an inverse of CLK, as indicated by the bubble on the clock input.

In operation, shadow latch 234 is intended to shadow the received DATA value stored in standard flip flop 202 of the data path, in that DATA is latched in both at the same time (i.e. at the same edge of CLK). However, if DATA arrives too late to shadow latch 234 (e.g. as DDATA), in violation of its required setup time, shadow latch 234 will not successfully latch DATA. A tap of delay generator 208 is programmably controlled using select signals S0-S2 in order to vary the data set up timing margin to shadow latch 234. The values of S0-S2 can be set (by, for example, testing circuit 124) to select a desired setup timing margin for shadow latch 234. In the illustrated embodiment, the values of S0-S2 are provided as a 3-bit value, denoted as [S2:S0], in which a "0b" preceding a value indicates a base two (i.e. binary) value. For example, the last tap of delay generator 208 (selected with [S2:S0]=0b111) corresponds to the longest delay of the data generated by delay generator 208. If the last tap is selected, DATA_D7 (having the longest delayed time for DATA) is provided to shadow latch 234 via MUX 232. Each of standard flip flop 202 and shadow latch 234 latch a value at their input with respect to a same clock edge of CLK. If compare circuit 242 determines that the outputs of shadow latch 234 and standard flip flop 202 match (e.g. that the latched shadow output equals DATA_OUT), then compare circuit 242 negates the match error indicator to a zero, indicating that the timing margin was successfully met (i.e. no error). However, if there is not a match, the margin was not successfully met, in which case, compare circuit 242 asserts the match error indicator to a one to indicate that the timing margin was not met. At the subsequent falling edge of CLK, the output of compare circuit 242 (i.e. the match indicator) is latched into error latch 240 and provided as an error indicator signal, ERROR.

In this manner, each data delay element (i.e. each tap of delay generator 208) may correspond to a warning level of impending failure of the data path. For example, when the selected data delay element selected by [S2:S0] results in assertion of ERROR (at a logic level one), the setup margin provided by [S2:S0] has failed. In one embodiment, [S2:S0]=0b111 selects DATA_D7 provided by delay element D7 (i.e. tap D7), in which each decremented value of [S2:S0] selects an incrementally lesser delayed version of the data. For example, [S2:S0]=0b110 selects DATA_D6 provided by delay element D6 (i.e. tap D6), [S2:S0]=0b101 selects DATA_D5 provided by delay element D5 (i.e. tap D5), etc. With [S2:S0]=0b000, the DATA is selected, with the lowest delay (i.e. tap D0). Each decreasing level of delay may therefore correspond to an increasing warning level. For example, as [S2:S0] is set to decreasing values starting from 0b111, if ERROR is first asserted with the selection of tap D7 ([S2:S0]=0b111) or tap D6 ([S2:S0]=0b110), a lower warning is indicated because there is still timing margin available to handle delays in the data path due to aging. However, if ERROR is asserted with the selection of tap D5 ([S2:S0]=0b101) or tap D4 ([S2:S0]=0b100), a higher level of warning is indicating because there is less timing margin available to handle delays in the data path due to aging. When ERROR is asserted with the selection of anything lower than tap D4 ([S2:S0]<0b100), corresponding to delay element D3 or lower), a critical level of warning is indicating. With a critical level of warning, failure of the data path is imminent.

Note that, in alternate embodiments, sensing circuitry 200 of MSF 250 may include any number of data delay taps, which can correspond to any granularity of warning levels, in which any number of select signals may be used to select the appropriate data delay tap. Similarly, delay generator 208 can be designed such that increasing values of the select signals may instead correspond to decreasing delays and thus decreases in warning level. For example, [S2:S0] =0b000 may instead select tap D7, and [S2:S0]=0b11 may select tap D0. Alternatively, any type of decoding may be used on the select signals to correctly select each delay tap (i.e. delay element) in the daisy chain of delay elements.

An MSCF, as will be described below, is similar to MSF 250, including the margin sensing circuitry of MSF 250 but further including correcting circuitry. During a testing period of operation, a self-test can be performed by SoC 100 (e.g. by testing circuit 124) which can determine, for each critical MSF or MSCF, an associated warning level at that point in time. In one embodiment, in which an MSCF is used at the critical endpoint rather than just an MSF as described in FIG. 2, the correction circuitry may be used to pull back the associated level of warning by selectively applying delay to the clock signal by using clock select signals. For example, by incrementally increasing the delay on the clock signal (to produce a delayed version of CLK (DCLK)), a selected data delay tap which resulted in assertion of ERROR may no longer result in assertion of ERROR. That is, the delay in the clock may offset the margin timing sufficiently to allow the data path to meet the timing margin. However, as the delay in the clock is increased within a critical MSCF, near critical MSCFs corresponding to the critical MSCF should also be checked in which the corresponding delay of the clock in each near critical MSCF may require adjusting with its corresponding clock select signals. By adjusting the clock in the critical and near critical MSCFs to incrementally correct the timing margins, the life of the data path can be extended by being able to handle greater delays in the data path due to aging. In one embodiment, the correction circuitry in each MSCF incrementally adjusts the clock, as needed, until no further timing margin or clock adjustment is available, at which point, assertion of ERROR corresponds to imminent failure of the data path without further correction available.

Figure 3:
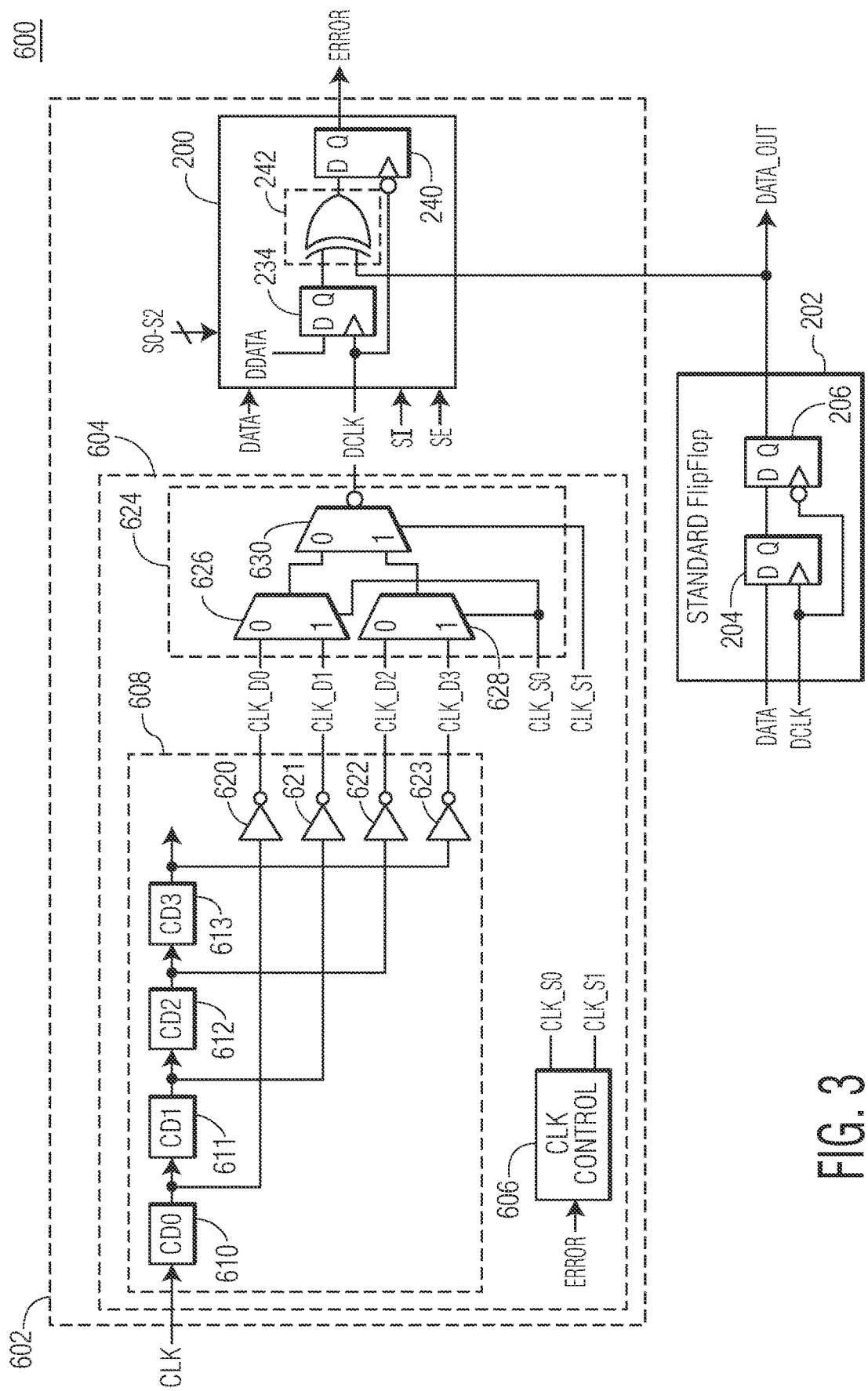
FIG. 3 illustrates, in schematic form, a standard flip flop along with corresponding margin sensing and correcting circuitry, including delay generation circuitry, of the SoC of FIG. 1, in accordance with one embodiment of the present invention.

FIG. 3 illustrates, in block diagram form, an embodiment of an MSCF 600 which includes standard flip flop 202 along with corresponding margin sensing circuitry 200 and corresponding correcting circuitry 604 (which may also collectively be referred to as testing circuitry). The descriptions provided above with respect to MSF 250 for elements with like numerals also apply to MSCF 600. For example, standard flip flop 202 and margin sensing circuitry 200 operate as described above, except that rather than receiving CLK as the input clock signal, the delayed CLK (DCLK) generated by correcting circuitry 604 is received and used as the clock signal for the all the clock inputs. As seen in the portion of circuitry 200 illustrated in FIG. 3, DCLK is provided to the clock input of shadow latch 234 and the inverted clock input of error latch 240. Similarly, DCLK is provided to the clock and inverted clock inputs of latches 204 and 206, respectively, of standard flip flop 202.

Correcting circuitry 604 generates DCLK based on CLK, and includes a clock delay generator 608 and a selector circuit 624 (which, in one embodiment, may be implemented as a 4:1 MUX). Clock delay generator 608 operates similar to delay generator 208, but generates delayed clock signals from a received clock signal rather than delayed data signals from a received data signal. Clock delay generator 608 receives the incoming system clock, CLK, and includes four daisy-chained clock delay units CD0 610-CD3 613 as well as four inverters 620-623. CLK is propagated through the clock delay units, in which each clock delay unit of clock delay units 610-613 provides an output to a corresponding inverter 620-623, respectively. Each inverter of inverters 620-623 provides a corresponding delayed clock output, CLK_D0 to CLK_D3, respectively. Since the clock delay units are daisy chained, the delays of the clock delay units are additive with each output. For example, CLK_D0 is generated from CLK delayed by clock delay unit CD0, while CLK_D2 is generated from CLK delayed by clock delay units CD0+CD1+CD2, etc. The outputs of inverters 620-623 are provided to selector circuit 624, in which inverters 620-623 at the output of each clock delay unit help to sharpen the value of CLK provided to selector circuit 624. Each clock delay unit also provides a monotonic amount of delay (i.e. an increasing delay), irrespective of rising or falling clock edges, and are immune from aging effects.

Because there are four taps in the daisy chain of clock delay generator 608 (corresponding to the outputs of CD0-CD3), selector circuit 624 implements the function of a 4:1 MUX, in which one of the inputs to selector circuit 624 is selected based on a 2-bit select signal, CLK_S0-CLK_S1, which are received from clock control circuit 606 or may be received from testing circuit 124 as part of test signals 112. In this manner, by programming the values of the clock setting signals, CLK_S0 and CLK_S1, a particular tap of the daisy chain can be selected to provide a delayed CLK value, in which each of CLK_D0 up to CLK_D3 provides an increasing delay for the delayed CLK value, in equal incremental steps. Therefore, delay generator 608 along with selector circuit 634 implement a programmable delay generator, programmed by the received select signals CLK_S0-CLK_S2. (Select signals CLK_S0-CLK_S2 may also be referred to as control signals or clock select signals and are denoted as [CLK_S1:CLC_S0].) The selected delayed CLK value is provided at the output of selector circuit 624 as DCLK to the clock inputs of margin sensing circuitry 200 and standard flip flop 202.

In the illustrated embodiment, selector circuit 624 is implemented with MUXes 626, 628, and 630. A first data input of MUX 626 is coupled to receive CLK_D0, a second data input of MUX 626 is coupled to receive CLK_D1, and a control input of MUX 626 is coupled to receive CLK_S0. A first data input of MUX 628 is coupled to receive CLK_D2, a second data input of MUX 628 is coupled to receive CLK_D3, and a control input of MUX 628 is also coupled to receive CLK_S0. A first data input of MUX 630 is coupled to receive an output of MUX 626, a second data input of MUX 630 is coupled to receive an output of MUX 628, a control input of MUX 630 is coupled to receive CLK_S1, and an inverted output of MUX 630 provides DCLK. For each of MUXes 626, 628, and 630, when the control input is negated (at a logic level zero), the first data input is provided as the corresponding output, and when the control input is asserted (at a logic level one), the second data input is provided as the corresponding output. Note that the selected delayed CLK value is inverted at the output of MUX 630 when provided as DCLK (since the inputs were provided via inverters 620-623). Therefore, with each increasing value of [CLK_S1:CLC_S0] from 0b00 to 0b11, CLK is provided with an increasing delay as DCLK. When [CLK_S1:CLC_S0]=0b00, CLK is shifted by the smallest delay amount, and when [CLK_S1:CLC_S0]=0b11, CLK is shifted by the largest amount.

In one embodiment, CLK should not be delayed more than DATA, therefore, clock delay generator 608 includes fewer taps than data delay generator 208. In one embodiment, clock delay generator 608 includes half the taps of data delay generator 208.

In operation, correcting circuitry 604 can adjust the clock by adding delay (i.e. shifting the clock) to allow flip flop 202 to meet its timing margin, as the data path ages and slows down. For example, if [S0:S2]=0b100 such that DATA_D4 (tap D4) is selected and [CLK_S1:CLC_S0]=0b00 so as to select the lowest clock delay (tap CD0), and ERROR is asserted indicating that the timing margin for flip flop 202 has not been met with the lowest delayed clock, [CLK_S1:CLC_S0] can be incremented to 0b01. In this case, the delayed clock, CLK_D1, provided as DCLK may be sufficient to now allow the timing margin to be met, even with tap D4 still selected. With the delayed clock CLK_D1, when scanning through decreasing values of [S2:S1] from 0b111, ERROR may now first be asserted when tap D5 is selected rather than when tap D4 is selected. In this situation, the warning level corresponding to the asserted ERROR was pulled back from the warning level associated with tap D4 to the lower warning level associated with tap D5, thus offsetting or correcting the effects of aging on the timing margin.

If, after continued aging, even with [CLK_S1:CLC_S0] set to 0b01, the warning level again increases to the warning level associated with tap D4 (because the timing margin has been shortened due to aging), [CLK_S1:CLC_S0] can again be increased to, e.g., 0b10, which provides an even greater delayed clock, CLK_D2, as DCLK. This may be sufficient to again pull back the warning level. However, as aging continues, once the delayed clock has been delayed with the greatest allowable delay, CLK_D3, and the warning level is again at the warning level associated with tap D4, no more clock adjustment is available and thus no more correction can be provided to maintain the warning level at the D4 level or lower. In this example, D4 may be considered a critical warning level. Therefore, the asserted ERROR in this case, which may occur with tap D4 (without additional correction available) or which may occur at a lower tap than D4 (e.g. at tap D3 or tap D2), may be treated differently and handled by testing circuitry in way to mitigate or prevent failure due to no longer being able to meet the timing margins. For example, an interrupt can be generated to alert of the critical warning. Use of the critical MSCFs and near-critical MSCFs to extend the lifetime of SoC 100 will be described in more detail below in reference to FIGS. 6 and 7.

Figure 4:
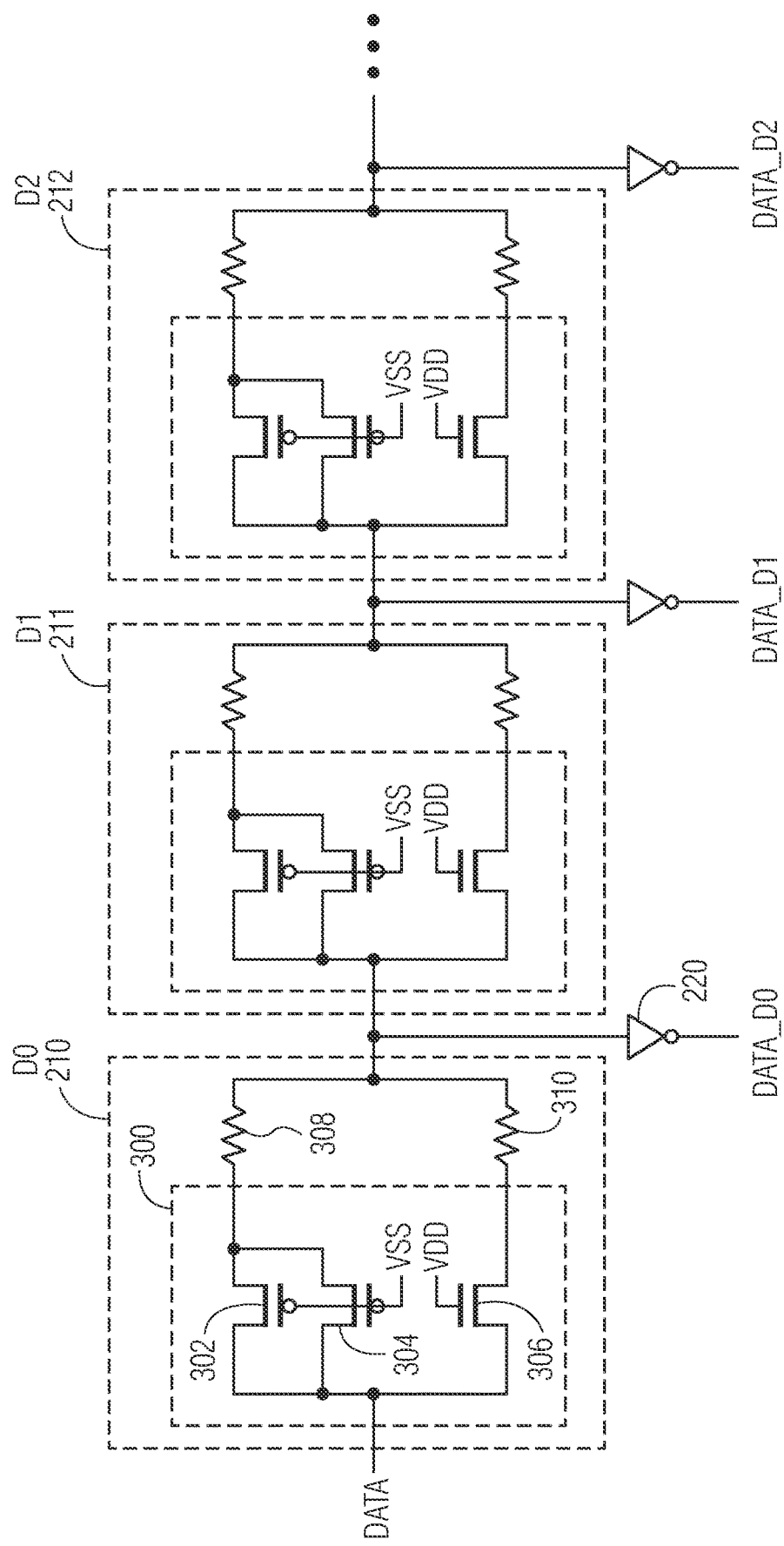
FIG. 4 illustrates, in schematic form, the delay generation circuitry of FIGS. 2 and 3, in accordance with one embodiment of the present invention.

FIG. 4 illustrates, in schematic form, delay generator 208 in accordance with one embodiment of the present invention, including delay units D0, D1, and D2. Note that the remaining data units of delay generator 208, D3-D7, may have the same form as each of D0-D2. Connectivity and functionality of each delay unit will be described in reference to D0. The same descriptions, though, apply analogously to each of D1-D7. Further, in other embodiments, delay generator 208 can have any number of delay units, depending on the number of taps desired for the delayed DATA, in which each delay unit can be analogous to D0 as well. Also, the descriptions of delay generator 208 apply analogously to delay generator 608. That is, the same explanation and circuitry for D0-D2 of FIG. 4 to produce DATA_D0-DATA_D2 apply analogously to CD0-CD2 to produce CLK_D0-CLK_D2 (and analogously to any clock delay unit to produce a corresponding delayed clock).

Delay unit D0 includes a transmission gate 300 coupled between a data input of D0 and a data output of D0. D0 also includes resistive elements 308 and 310 between transmission gate 300 and the output of D0. Note that the output of D0 is coupled to the input of D1, and is provided as an input to inverter 220. The input of D0 receives DATA. Transmission gate 300 includes an n-type metal oxide semiconductor (NMOS) transistor 306 coupled in parallel with p-type metal oxide semiconductor (PMOS) transistors 302 and 304. Transistor 306 has a first current electrode coupled to the input of D0, a second current electrode connected to a first terminal of resistive element 306, and a control electrode coupled to a first voltage supply terminal. Transistors 302 and 304 each have a first current electrode connected to the input of D0, a second current electrode coupled to a first terminal of resistive element 308, and a control electrode coupled to a second voltage supply terminal. The first voltage supply terminal provides a first supply voltage, VDD, and the second voltage supply terminal provides a second voltage supply, VSS, which is less than VDD. (Note that each of the first and second voltage supply terminals may also be referred to as VDD and VSS, respectively.) VSS at the control electrodes of transistors 302 and 304 maintains each of transistors 302 and 304 in the conductive state (ON), and VDD at the control electrode of transistor 306 maintains transistor 306 in the conductive state (ON).

In the illustrated embodiment, two PMOS transistors are used in parallel with only one NMOS transistor due to the weaker drive strength of PMOS transistors compared to NMOS transistors so as to evenly transmit DATA at either a logic level high or a logic level low. This maintains the delay time through transmission gate 300 consistent regardless of whether DATA is a one or a zero. Also, the use of transmission gates results in D0 providing a monotonic delay that is immune to the effects of aging. Further, resistive elements such as resistive elements 308 and 310, which may be implemented as metal resistors which are also immune to aging, can be used to increase the delay through each delay unit. With transistors 302, 304, and 306 turned ON, DATA is transmitted from the input of D0 to the output of D0 with a delay time determined by delay through transmission gate 300 and resistive elements 308/310, and then to the input of D1 through to the output of D1, then to the input of D2 through to the output of D2. In the illustrated embodiment, each unit adds an additional delay (of the same amount) to DATA such that the output of each delay unit D0-D7 increases in fixed steps. In this manner, DATA_D2 is a delayed version of DATA_D1, which is a delayed version of DATA_D0.

In the illustrated embodiment, the transmission gate of each delay unit operates as a resistive element. In an alternate embodiment, each delay unit may include only a resistive element, such as a metal resistor, instead of a transmission gate. Alternatively, other elements may be used in each delay unit to provide a delay, but these elements should also be elements or configuration of elements which are not affected, or are only minimally affected, by aging of the SoC.

Figure 5:
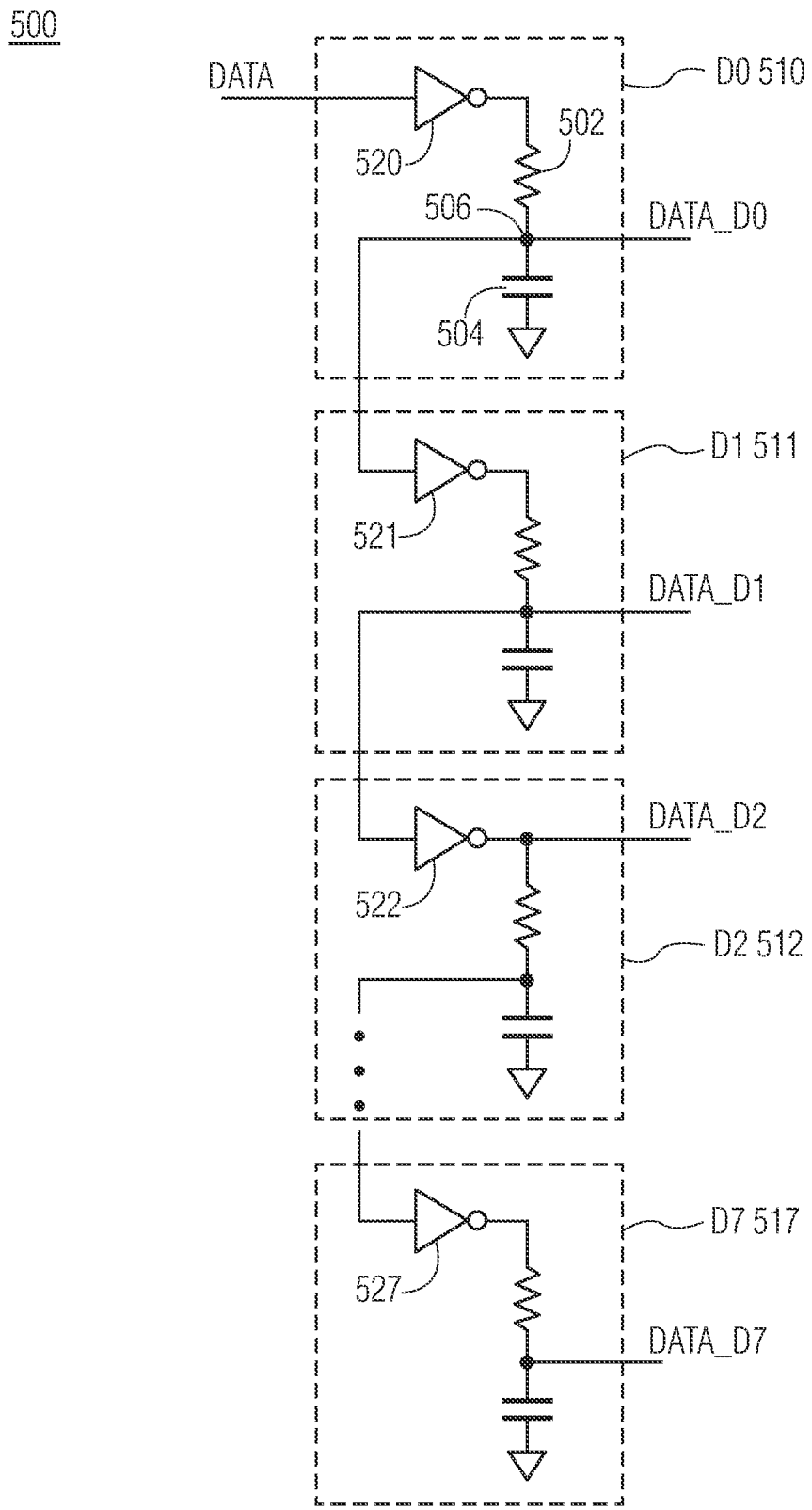
FIG. 5 illustrates, in schematic form, the delay generation circuitry of FIGS. 2 and 3, in accordance with one embodiment of the present invention.

FIG. 5 illustrates, in schematic form, delay generator 500 in accordance with one embodiment of the present invention, in which delay generator 500 is another example for implementing delay generator 208 of FIG. 2 or delay generator 608 of FIG. 3, using resistors and capacitors instead of transmission gates. Similar to delay generator 208, delay generator 500 receives DATA and includes 8 daisy chained delay units D0 510-D7 517. Delay units D0 510-D7 517 provide outputs DATA_D0-DATA_D7, which, as illustrated in FIG. 2, are provided to MUX 230. Delay generator 500 of FIG. 5 illustrates delay units D0, D1, D2, and D7. Note that the remaining data units of delay generator 500, D4-D7, may have the same form as each of D0-D2 and D7. Connectivity and functionality of each delay unit will be described in reference to D0. The same descriptions, though, apply analogously to each of D1-D7. Further, as with delay generator 208, in other embodiments, delay generator 500 can have any number of delay units, depending on the number of taps desired for the delayed DATA, in which each delay unit can be analogous to D0 as well. Note also that any descriptions provided for the data delay units of FIG. 5 to produce the delayed DATA signals apply analogously to any clock delay units to produce the delayed CLK signals, in which delay generator 500 of FIG. 5 may receive CLK instead of DATA, and provide CLK_D0-CLK_D3 instead of DATA_D0-DATA_D7.

Delay unit D0 510 includes an inverter 520, a resistor 510, and a capacitor 504. Inverter 520 has an input coupled to an input of D0 and an output coupled to a first terminal of resistor 502. A second terminal of resistor 502 is coupled to a first terminal of capacitor 504 at a circuit node 506. A second terminal of capacitor 504 is coupled to VSS (e.g. ground). Circuit node 506 is coupled to an output of D0, which provides DATA_D0. Delay units D0 510-D7 517 are daisy chained, therefore the output of D0 is coupled to the input of D1 (to an input of the inverter of D1), the output of D1 is coupled to the input of D2 (to an input of the inverter of D2), etc. Resistor 502 and capacitor 504 form an RC filter, in which the delay of DATA_D0 from DATA is determined by the delay through inverter 520 and the RC constant of the RC filter. Therefore, the inverter in combination with the RC filter of the delay units provide the monotonic delays (e.g. increasing delays) for producing DATA_D0-DATA_D7. As with the transmission gates, the delay units of delay generator 500 provide monotonic delays which are immune to the effects of aging. Note that inverters 520-527, each within its corresponding delay unit, correspond to inverters 220-227 of delay generator 208, but are instead located within the daisy chained delay units, at the inputs of the delay units, rather than located at the output of each delay unit. Also, note that any combination of one or more resistive elements may be used to implement each resistor of D0-D7 and any combination of one or more capacitor elements may be used to implement each capacitor of D0-D7.

Figure 6:
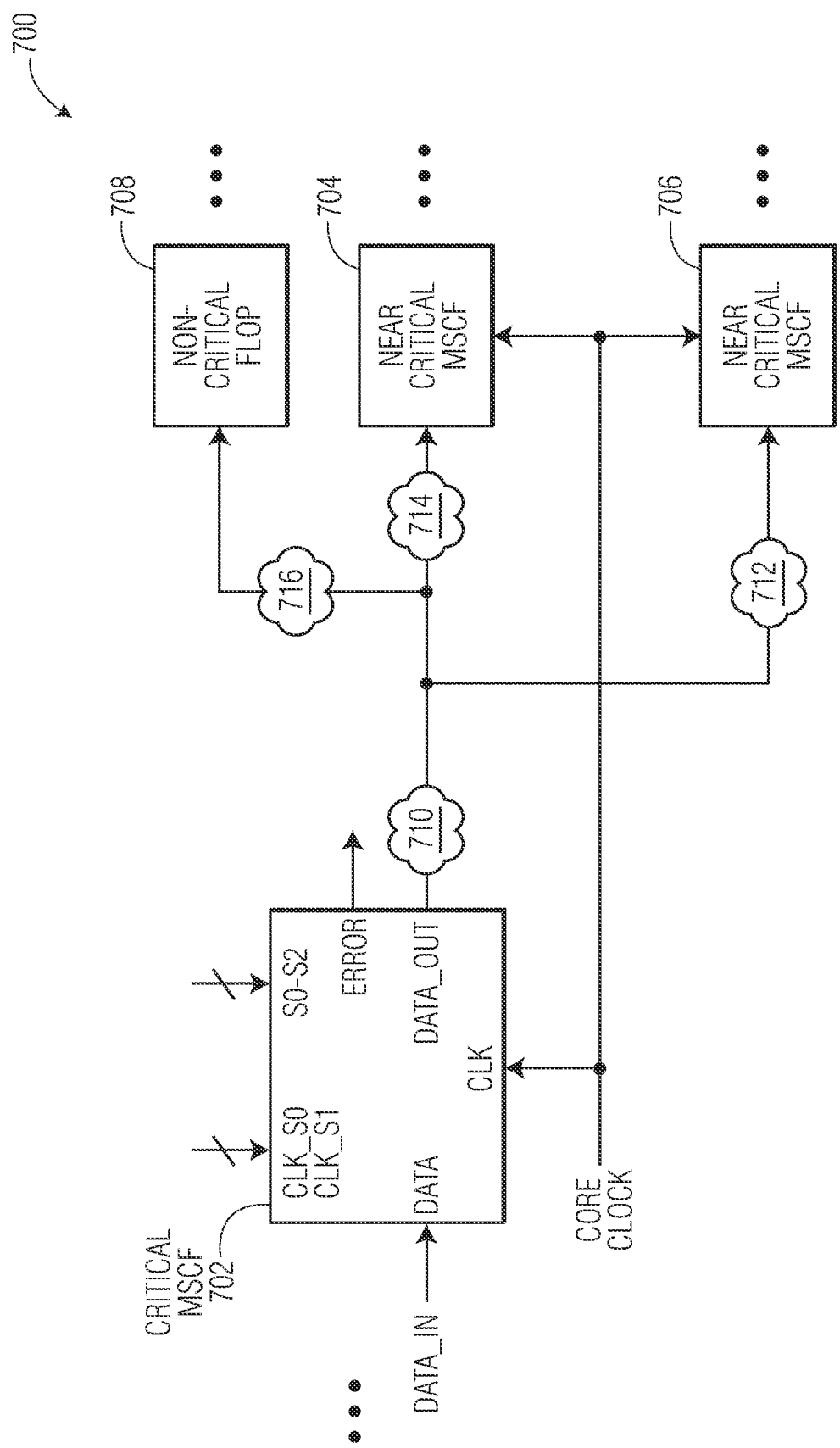
FIG. 6 illustrates, in block diagram form, critical timing paths of the SoC of FIG. 1, in accordance with one embodiment of the present invention.

FIG. 6 illustrates, in block diagram form, a portion 700 of SoC 100 which includes a critical MSCF 702, a non-critical flop 708, near-critical MSCFs 704 and 706, and logic clouds 710, 712, 714, and 716, in accordance with one embodiment of the present invention. Portion 700 may be located, for example, in a core of SoC 100. Each of critical MSCF 702 and near critical MSCFs 704 and 706 can be implemented with MSCF 600 of FIG. 3. Non-critical flop 708 represents a flip flop that did not need to be implemented with an MSCF and therefore can be implemented as a standard flop, or as an MSF flop (e.g. MSC 250 of FIG. 2). Each of flops 702, 704, 706, and 708 are endpoints located along critical data paths, in which MSCF 702 corresponds to an endpoint which was identified as critical. Each of MSCFs 704 and 706 correspond to endpoints which were identified as near critical because they are located downstream from critical MSCF 702 and any timing adjustments applied by the correction circuitry of MSCF 702 affects the timing of MSCFs 704 and 706. Therefore, each of MSCFs 704 and 706 also include correcting circuitry which are controlled with an independent set of clock select signals ([CLK_S1: CLK_S0]) to allow for clock adjustment in response to corrections applied in MSCF 702. That is, each MSCF can receive its own corresponding set of clock select signals and data delay signals. The corresponding core clock, CLK, is provided to each flop.

Between any two endpoints, the output signal of one endpoint may be propagated through a cloud of logic (which may also be referred to as a cone of logic) before reaching a downstream endpoint. Each cloud of logic (i.e. logic cloud) may be any combination of combinational digital circuitry. For example, DATA_OUT of MSCF 702 may be propagated through logic clouds 710 and 714, in which logic cloud 714 provides a data input to MSCF 704. Similarly, DATA_OUT of MSCF 702 may be propagated through logic clouds 710 and 712, in which logic cloud 712 provides a data input to MSCF 704, and though logic clouds 710 and 716, in which logic cloud 716 provides a data input to flop 706. Therefore, note that the inputs of each of near-critical MSCFs 704 and 706 are affected by any timing adjustments made in critical MSCF 702. The values of each of the corresponding clock select signals and corresponding data delay signals of any of the MSCFs can be stored and adjusted, as needed, within testing circuit 124 and provided, as needed, via test signals such as test signals 112 and 120, to the corresponding MSCFs. Alternatively, they may be stored elsewhere within SoC 100 and adjusted by self-test circuitry elsewhere within SoC 100.

Figure 7:
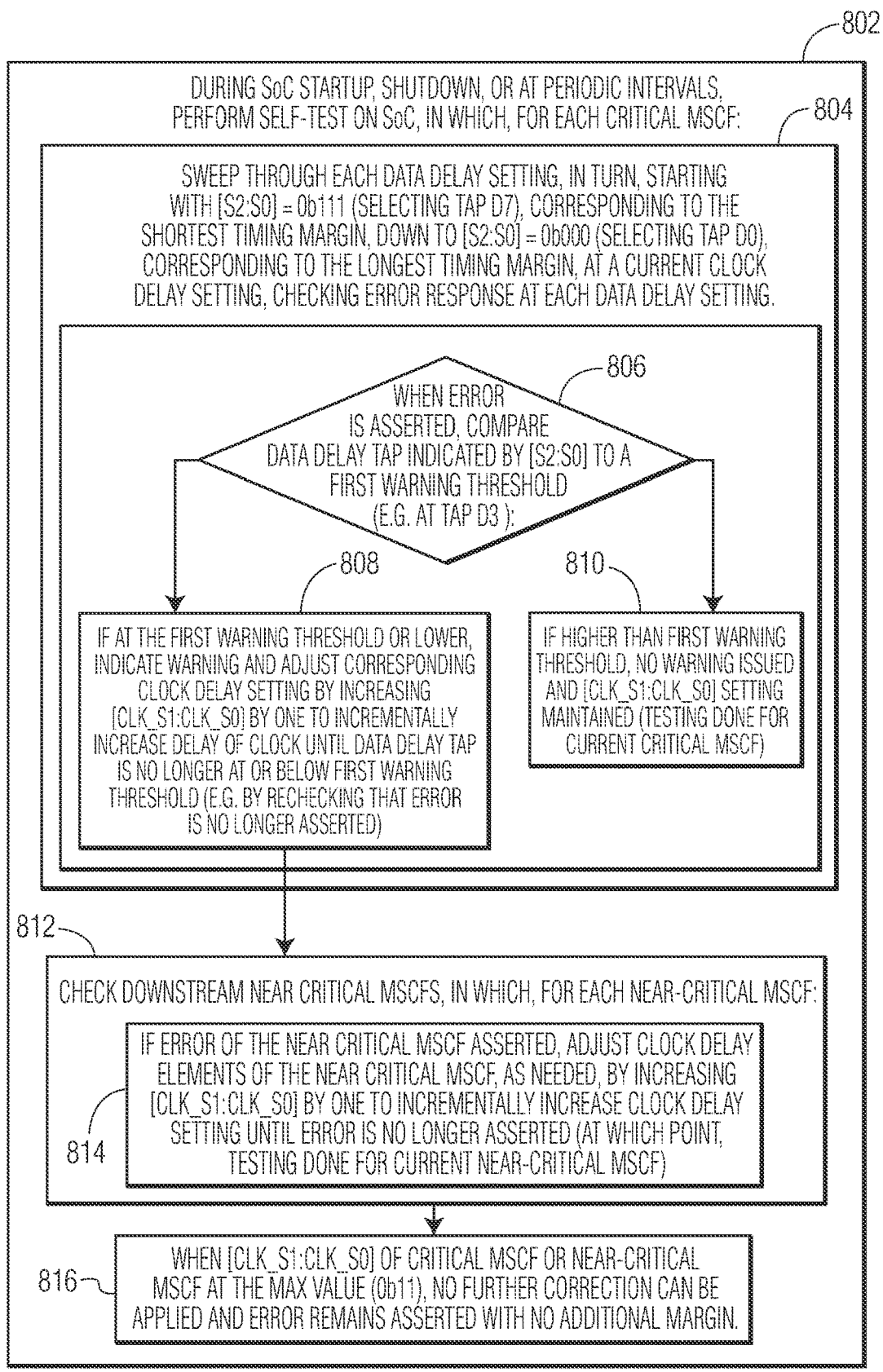
FIG. 7 illustrates, in flow diagram form, operation of a self-test in the SoC of FIG. 1 using the testing circuitry of FIG. 6, in accordance with one embodiment of the present invention.

FIG. 7 illustrates, in flow diagram form, a self-test 802 which can be performed on any critical MSCF of SoC 100 selected for testing (e.g. on each MSCF within a core, block, portion, or entirety of SoC 100). Self-test 802 can be performed upon startup of SoC 100, shutdown of SoC 100, or at periodic intervals. For each critical MSCF selected for testing, self-test 802 begins with block 804 in which a sweep is performed through each data delay setting, in turn, starting with [S2:S0]=0b111 (which selects tap D7) down to [S2:S0]=0b000 (which selects tap D0) at a current clock delay setting, checking the error response (e.g. the value of ERROR) at each data delay setting. Setting [S2:S0] to 0b111 to select D7 corresponds to providing the shortest timing margin at a current clock delay setting of DCLK for the standard flop (202) of the MSCF, while setting [S2:S0] to 0b000 corresponds to providing the longest timing margin at the current clock delay setting of DCLK. In one embodiment, the current clock delay setting initially corresponds to [CLK_S1:CLK_S0=0b00] (providing CLK_0 as DCLK). The timing margin is shortest when selecting tap D7 because the data input is delayed the longest. Therefore, if ERROR is not asserted when tap D7 is selected, then MSCF is at the lowest risk level of failure due to aging since the shortest timing margin was successfully met.

After applying each data delay setting, ERROR is checked, and when ERROR is asserted, the corresponding data delay tap indicated by the value of the delay setting [S2:S0] which caused ERROR to be asserted is compared to a first warning threshold (at decision diamond 806). (The first warning threshold may be considered a critical warning level, and may therefore be referred to as a critical warning threshold.) For example, in the illustrated example, the first warning threshold corresponds to D3 ([S2:S0]=0b011). If the value of [S2:S0] which resulted in the ERROR is higher than 0b011 (therefore greater than D3), then (at block 810) the first warning threshold has not yet been reached and the current clock delay setting [CLK_S1:CLK_S0] is maintained. At this point, testing is done for the current MSCF and method 800 begins again at block 804 for the next critical MSCF.

If, at decision diamond 806, the value of [S2:S0] which resulted in the error is at the first warning threshold or lower (if [S2:S0]<=0b011), the method continues to block 808 in which a warning is indicated, having a warning level corresponding to D3. At block 808, the corresponding clock delay setting [CLK_S1:CLK_S0] is increased by one to incrementally increase the delay of the clock, until the current data delay setting no longer results in an error at or below the first warning threshold. For example, this can be done by rechecking whether or not ERROR is asserted after each increase in the clock delay setting. If ERROR is no longer asserted, then the warning level is no longer at data tap D3, and is presumably at a level higher than D3 (e.g. pulled back to data tap D4) due to the successful adjustment of the clock delay setting.

After the values of [CLK_S1:CLK_S0] are appropriately set (at block 808), method 800 proceeds with block 812 in which each downstream near critical MSCF is checked. For example, at block 814, if ERROR of the near critical MSCR being checked is asserted, the corresponding clock delay setting [CLK_S1:CLK_S0] of the near critical MSCF is incrementally increased by one until ERROR is no longer asserted (which completes testing for the current near critical MSCF). Once block 814 is complete for each near critical MSCF, method 800 returns to block 804 for the next critical MSCF. This continues until all critical MSCFs (and the corresponding down stream near critical MSCFs for each critical MSCF) has been checked. As indicated by block 816, if, at any point while adjusting any of the corresponding clock delay settings for a critical MSCF or near critical MSCF, the maximum value is reached ([CLK_S1:CLK_S0]=0b11) but ERROR is still asserted, then no further correction can be applied and ERROR remains asserted without any additional margin available. This ERROR may be marked as a critical error (an ERROR without additional margin available) to testing circuit 124, which can respond accordingly. For example, if tap D3 corresponds to a critical warning level for SoC 100, and no clock margin is available to pull back the warning level, then testing circuit 124 can take appropriate steps, such as restarting SoC 100 or shutting down SoC 100.

In this manner, while the margin sensing circuitry of an MSF or an MSCF may be used during functional operation to warn of possible imminent failure of the SoC by setting [S2:S0] to select the delay tap which provides the minimum required setup margin such that assertion of ERROR indicates that the minimum required setup margin has not been met, the correcting circuitry can be used in combination with the margin sensing circuitry of an MSCF during any self-test period to set [CLK_S1:CLK_S0] in such a way as to extend the lifetime of an SoC by further delaying the imminent failure. Therefore, during normal operation, the values of the select signals and clock delay signals can be statically set to desired values to warn of imminent failure, and during self-testing, the select signals and clock select signals can be incrementally adjusted to determine appropriate settings which compensate for aging effects and lower associated warning levels (at least until no further adjustments are available).

Note that compare circuit 242 can be implemented in a variety of ways using different circuitry or elements than those illustrated. For example, any of the MUXes or selector circuits can be implemented using different circuitry, and the MUXes herein may be referred to as selector circuits. Furthermore, the delay generators (e.g. 238, 638, 500) may produce any number of delayed outputs (e.g. include any number of taps), and therefore, selector circuits 230 and 624 may include any number of inputs, and the control or select value (e.g. S0-S2, CLK_S0-CLK_S1) can include any number of bits as needed to select a desired delayed data output. Also, while FIGS. 2 and 3 illustrate delay generators 208 and 608 as including a plurality of daisy chained delay units, different circuitry and arrangements may be used to provide the plurality of delayed data outputs with increasing delay. Furthermore, the daisy chaining of the delay units of FIGS. 2 and 3 can be done by implementing multiple levels of multiplexing to provide improved balance and delay control, but alternatively, other multiplexing schemes can be used.

Also, as described above in reference to MUX 230 of FIG. 2, the margin sensing circuitry may also be involved during scan testing. When scan testing is enabled (e.g. when SE is a one), SI is provided to the data input of shadow latch 234, rather than the output of MUX 230. During scan testing, latch 204 of standard flip flop 202 would also be set up to receive a scan input rather than an input from the functional logic connected to standard flip flop 202. Therefore, each of flip flop 202, shadow latch 234, and error latch 240 can be used in as part of a scan chain during scan testing. In one embodiment, since standard flip flop is implemented as a Master-Slave flip flop with latches 204 and 206, shadow latch 234 can be used together with error latch 240 during scan testing to match timing of a master-slave flip flop.

Therefore, by now it can be appreciated how margin sensing and correcting flip flops can be used at selected endpoints of critical data paths to allow for self testing and correction to offset timing delays caused, for example, by aging of the circuits. For example, in one embodiment, for each critical endpoint, a timing margin warning level is determined with margin sensing circuitry which allows for the setting of different timing margins at the critical endpoint. In response to the timing margin warning level, a clock delay can be adjusted in order to pull back the warning level. This may result in extending the lifetime of the SoC due to the adjusted critical endpoint. However, in adjusting the critical endpoint, timing margins can affect nearby near critical endpoints. As with the critical endpoints, though, margin sensing and correcting flip flops at near critical endpoints can be adjusted, as needed, in response to clock delay adjustments of any critical endpoint. While the margin sensing circuitry within any of the critical and near critical endpoints are capable of providing warnings, even during functional operation, when failure is imminent due to aging effects, the additional correcting circuitry used in combination with the margin sensing circuitry can result in extending the useful lifetime of the critical timing paths. In one embodiment, correction settings for the clock adjustments are determined during self-testing, which can be performed during, e.g. startup, shutdown, or periodically during operation of the SoC.

While the above descriptions were provided in reference to detecting impending failures in the case of aging, the impending failure detection described herein can also be used in other applications, such as to detect impending failure due, for example, to voltage drop, latent defects, operation at high temperatures, etc.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different delay generators may be provided to delay the input data by a programmable delay amount which is immune to ageing effects. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that in the below embodiments, any aspect can be used with any other aspect or embodiment.

In one embodiment, an integrated circuit includes a critical data path including a flip flop configured to receive a data input and provide a latched data output; a margin sensing circuit coupled to the flip flop; and a correcting circuit. The margin sensing circuit includes a delay generator configured to receive the data input and provide a plurality of delayed data outputs wherein the plurality of delayed data outputs correspond to delayed versions of the data input with increasing amounts of delay; a selector circuit configured to select a delayed data output of the plurality of delayed data outputs based on a set of select signals, and having an output; a shadow latch corresponding to the flip flop, having an input coupled to the output of the selector circuit and configured to latch a value at its input to provide as a latched shadow output; a comparator circuit configured to provide a match error indicator based on a comparison between the latched data output from the flip flop and the latched shadow output from the shadow latch; and an error latch configured to latch an error value based at least on the match error indicator and to provide the latched error value as an error indicator. The correcting circuit includes a clock delay generator configured to receive a clock and provide a plurality of delayed clocks wherein the plurality of delayed clocks correspond to delayed versions of the clock with increasing amounts of delay; and a clock selector circuit configured to select a delayed clock of the plurality of delayed clocks based on a set of clock select signals, wherein each of the flip flop and the shadow latch are clocked by the selected delayed clock.

In one aspect of the above embodiment, the delay generator includes a plurality of daisy chained delay units configured to receive the data input, wherein each delay unit of the delay generator provides a monotonic delay and outputs a different one of the delayed data outputs, and the clock delay generator includes a plurality of daisy chained clock delay units configured to receive the clock, wherein each clock delay unit of the clock delay generator unit provides a monotonic delay and outputs a different one of the delayed clocks. In another aspect, the flip flop is further characterized as a master-slave flip flop having a master latch and a slave latch. In another aspect, the delay generator provides a total of M delayed data outputs and the clock delay generator provides a total of N delayed clocks, wherein each of M and N are integers greater than one, and N is less than M. In a further aspect, N is at most half of M. In another aspect, the integrated circuit further includes testing circuitry configured to perform a self-test using the margin sensing circuit and the correcting circuit. In a further aspect, the testing circuitry is configured to apply a first value of the set of select signals to select a first delayed data output as the selected delayed data output of the selector circuit value of the sweep and a first value of the set of clock select signals to select a first delayed clock as the selected clock, and, when the error indicator indicates an error, adjust the first value of the set of clock select signals to select a next delayed clock of the plurality of delayed clocks as the selected clock, wherein the next delayed clock has a greater delay of the clock than the first delayed clock. In yet a further aspect, the testing circuitry is configured to, when the error indicator indicates the error, incrementally adjust the first value of the set of clock select signals to select an incrementally delayed clock of the plurality of delayed clocks as the selected clock, checking the error indicator after each incremental adjustment, until the error indicator no longer indicates the error. In another further aspect, the testing circuitry is configured to adjust the first value to the set of clock select signals to select the next delayed clock when the error indicator indicates the error and a warning level of the error corresponds to a critical warning threshold. In yet a further aspect, each delayed data output of the plurality of delayed data outputs has a corresponding warning level, wherein the warning level increases with decreasing amounts of delay of the plurality of delayed data outputs. In yet a further aspect, when the error indicator indicates the error, the corresponding warning level of the selected delayed data output indicates the warning level of the error.

In another embodiment, an integrated circuit includes a critical data path including a plurality of margin sensing and correcting flip flops (MSCFs) each configured to receive a data input, a clock, a programmable set of data delay control signals, and a programmable set of clock select signals, and each configured to provide a latched data output and an error indicator; and testing circuitry configured to perform a self-test on the critical data path. Each MSCF includes a flip flop configured to receive the data input and provide the latched data output; a margin sensing circuit, and a correcting circuit. The margin sensing circuit includes a shadow latch corresponding to the flip flop, having an input coupled to receive a delayed version of the data input having a delay based on the set of data delay control signals and configured to latch a value at its input to provide as a latched shadow output; a comparator circuit configured to provide a match error indicator based on a comparison between the latched data output from the flip flop and the latched shadow output from the shadow latch; and an error latch configured to latch an error value based on the match error indicator and to provide the latched error value as an error indicator. The correcting circuit includes a clock delay generator configured to provide a plurality of delayed clocks wherein the plurality of delayed clocks correspond to delayed versions of the clock with increasing amounts of delay; and a clock selector circuit configured to select a delayed clock of the plurality of delayed clocks based on the set of clock select signals, wherein each of the flip flop and the shadow latch are clocked by the selected delayed clock.

In one aspect of the another embodiment, the testing circuitry is configured to, during the self-test on a selected MSCF of the plurality of MSCFs, for each delayed version of the data input of a plurality of delayed versions having decreasing delay: check the error indicator, and, when the error indicator indicates an error and the error has a warning level that is at least a threshold warning level, adjust a value of the set of clock select signals to select a next delayed clock of the plurality of delayed clocks as the selected clock, wherein the next delayed clock has a greater delay of the clock than the first delayed clock. In a further aspect, the testing circuitry is configured to, when the error indicator indicates the error and the warning level is at least the threshold warning level, incrementally adjust the value of the set of clock select signals to select an incrementally delayed clock of the plurality of delayed clocks as the selected clock, checking the error indicator after each incremental adjustment, until the error indicator no longer indicates the error. In another further aspect, when the error indicator indicates the error, the warning level of the error is indicated by an amount of delay of the delayed version of the data input. In yet a further aspect, the delayed version of the data input has a corresponding warning level, wherein the corresponding warning level increases with decreasing amounts of delay of the delayed version of the data input. In yet another further aspect, during the self-test on the selected MSCF of the plurality of MSCFs, after adjusting the value of the set of clock select signals to select the next delayed clock, the testing circuitry is further configured to check one or more downstream MSCFs whose data input is coupled to receive the latched data output from the selected MSCF. In yet a further aspect, the testing circuitry is configured to check each of the one or more downstream MSCFs by, when the error indicator of the downstream MSCF indicates an error, adjusting a value of the set of clock select signals of the downstream MSCF to select a next delayed clock of the plurality of delayed clocks of the downstream MSCF as the selected clock of the downstream MSCF, wherein the next delayed clock of the downstream MSCF has a greater delay of the clock than the first delayed clock of the downstream MSCF. In another yet further aspect, the selected MSCF is identified as a critical MSCF and the one or more downstream MSCFs are identified as near critical MSCFs. In another aspect of the another embodiment, each MSCF includes a delay generator which includes a plurality of daisy chained delay units configured to receive the data input, wherein each delay unit of the daisy chained delay units provides a monotonic delay and outputs different delayed versions of the data input with increasing amounts of delay, wherein the delayed version of the data input received by the shadow latch corresponds to an output of a daisy chained delay unit selected from the plurality of daisy chained delay units by the set of data delay control signals, and, in each MSCF, the clock delay generator includes a plurality of daisy chained clock delay units configured to receive the clock, wherein each clock delay unit of the daisy chained clock delay units provides a monotonic delay and outputs a different one of the delayed clocks.

What is claimed is:

1. An integrated circuit, comprising:
   a critical data path including a flip flop configured to receive a data input and provide a latched data output;
   a margin sensing circuit coupled to the flip flop, comprising:
   a delay generator configured to receive the data input and provide a plurality of delayed data outputs wherein the plurality of delayed data outputs correspond to delayed versions of the data input with increasing amounts of delay;
   a selector circuit configured to select a delayed data output of the plurality of delayed data outputs based on a set of select signals, and having an output;
   a shadow latch corresponding to the flip flop, having an input coupled to the output of the selector circuit and configured to latch a value at its input to provide as a latched shadow output;
   a comparator circuit configured to provide a match error indicator based on a comparison between the latched data output from the flip flop and the latched shadow output from the shadow latch; and
   an error latch configured to latch an error value based at least on the match error indicator and to provide the latched error value as an error indicator; and
   a correcting circuit coupled to the margin sensing circuit and the flip flop, comprising:
   a clock delay generator configured to receive a clock and provide a plurality of delayed clocks wherein the plurality of delayed clocks correspond to delayed versions of the clock with increasing amounts of delay; and
   a clock selector circuit configured to select a delayed clock of the plurality of delayed clocks based on a set of clock select signals, wherein each of the flip flop and the shadow latch are clocked by the selected delayed clock.

2. The integrated circuit of claim 1, wherein:
   the delay generator comprises a plurality of daisy chained delay units configured to receive the data input, wherein each delay unit of the delay generator provides a monotonic delay and outputs a different one of the delayed data outputs, and
   the clock delay generator comprises a plurality of daisy chained clock delay units configured to receive the clock, wherein each clock delay unit of the clock delay generator unit provides a monotonic delay and outputs a different one of the delayed clocks.

3. The integrated circuit of claim 1, wherein the flip flop is further characterized as a master-slave flip flop having a master latch and a slave latch.

4. The integrated circuit of claim 1, wherein the delay generator provides a total of M delayed data outputs and the clock delay generator provides a total of N delayed clocks, wherein each of M and N are integers greater than one, and N is less than M.

5. The integrated circuit of claim 4, wherein N is at most half of M.

6. The integrated circuit of claim 1, further comprising testing circuitry, configured to perform a self-test using the margin sensing circuit and the correcting circuit.

7. The integrated circuit of claim 6, wherein the testing circuitry is configured to:
   apply a first value of the set of select signals to select a first delayed data output as the selected delayed data output of the selector circuit value of the sweep and a first value of the set of clock select signals to select a first delayed clock as the selected clock, and
   when the error indicator indicates an error, adjust the first value of the set of clock select signals to select a next delayed clock of the plurality of delayed clocks as the selected clock, wherein the next delayed clock has a greater delay of the clock than the first delayed clock.

8. The integrated circuit of claim 7, wherein the testing circuitry is configured to, when the error indicator indicates the error, incrementally adjust the first value of the set of clock select signals to select an incrementally delayed clock of the plurality of delayed clocks as the selected clock, checking the error indicator after each incremental adjustment, until the error indicator no longer indicates the error.

9. The integrated circuit of claim 7, wherein the testing circuitry is configured to adjust the first value to the set of clock select signals to select the next delayed clock when the error indicator indicates the error and a warning level of the error corresponds to a critical warning threshold.

10. The integrated circuit of claim 9, wherein each delayed data output of the plurality of delayed data outputs has a corresponding warning level, wherein the warning level increases with decreasing amounts of delay of the plurality of delayed data outputs.

11. The integrated circuit of claim 10, wherein when the error indicator indicates the error, the corresponding warning level of the selected delayed data output indicates the warning level of the error.

12. An integrated circuit, comprising:
a critical data path including a plurality of margin sensing and correcting flip flops (MSCFs) each configured to receive a data input, a clock, a programmable set of data delay control signals, and a programmable set of clock select signals, and each configured to provide a latched data output and an error indicator, each MSCF comprising:
  a flip flop configured to receive the data input and provide the latched data output;
  a margin sensing circuit comprising:
    a shadow latch corresponding to the flip flop, having an input coupled to receive a delayed version of the data input having a delay based on the set of data delay control signals and configured to latch a value at its input to provide as a latched shadow output;
    a comparator circuit configured to provide a match error indicator based on a comparison between the latched data output from the flip flop and the latched shadow output from the shadow latch; and
    an error latch configured to latch an error value based on the match error indicator and to provide the latched error value as an error indicator; and
  a correcting circuit, comprising:
    a clock delay generator configured to provide a plurality of delayed clocks wherein the plurality of delayed clocks correspond to delayed versions of the clock with increasing amounts of delay; and
    a clock selector circuit configured to select a delayed clock of the plurality of delayed clocks based on the set of clock select signals, wherein each of the flip flop and the shadow latch are clocked by the selected delayed clock; and
testing circuitry configured to perform a self-test on the critical data path.

13. The integrated circuit of claim 12, wherein the testing circuitry is configured to, during the self-test on a selected MSCF of the plurality of MSCFs:
  for each delayed version of the data input of a plurality of delayed versions having decreasing delay:
    check the error indicator, and
    when the error indicator indicates an error and the error has a warning level that is at least a threshold warning level, adjust a value of the set of clock select signals to select a next delayed clock of the plurality of delayed clocks as the selected clock, wherein the next delayed clock has a greater delay of the clock than the first delayed clock.

14. The integrated circuit of claim 13, wherein the testing circuitry is configured to, when the error indicator indicates the error and the warning level is at least the threshold warning level, incrementally adjust the value of the set of clock select signals to select an incrementally delayed clock of the plurality of delayed clocks as the selected clock, checking the error indicator after each incremental adjustment, until the error indicator no longer indicates the error.

15. The integrated circuit of claim 13, wherein when the error indicator indicates the error, the warning level of the error is indicated by an amount of delay of the delayed version of the data input.

16. The integrated circuit of claim 15, wherein the delayed version of the data input has a corresponding warning level, wherein the corresponding warning level increases with decreasing amounts of delay of the delayed version of the data input.

17. The integrated circuit of claim 13, wherein during the self-test on the selected MSCF of the plurality of MSCFs, after adjusting the value of the set of clock select signals to select the next delayed clock, the testing circuitry is further configured to:
  check one or more downstream MSCFs whose data input is coupled to receive the latched data output from the selected MSCF.

18. The integrated circuit of claim 17, wherein the testing circuitry is configured to check each of the one or more downstream MSCFs by:
  when the error indicator of the downstream MSCF indicates an error, adjusting a value of the set of clock select signals of the downstream MSCF to select a next delayed clock of the plurality of delayed clocks of the downstream MSCF as the selected clock of the downstream MSCF, wherein the next delayed clock of the downstream MSCF has a greater delay of the clock than the first delayed clock of the downstream MSCF.

19. The integrated circuit of claim 17, wherein the selected MSCF is identified as a critical MSCF and the one or more downstream MSCFs are identified as near critical MSCFs.

20. The integrated circuit of claim 12, wherein:
  each MSCG comprises a delay generator comprising a plurality of daisy chained delay units configured to receive the data input, wherein each delay unit of the daisy chained delay units provides a monotonic delay and outputs different delayed versions of the data input with increasing amounts of delay, wherein the delayed version of the data input received by the shadow latch corresponds to an output of a daisy chained delay unit selected from the plurality of daisy chained delay units by the set of data delay control signals, and
  in each MSCF, the clock delay generator comprises a plurality of daisy chained clock delay units configured to receive the clock, wherein each clock delay unit of the daisy chained clock delay units provides a monotonic delay and outputs a different one of the delayed clocks.

* * * * *